United States Patent
Shi et al.

(10) Patent No.: US 12,527,150 B2
(45) Date of Patent: Jan. 13, 2026

(54) QUANTUM DOT SUBSTRATE INCLUDING NANOPARTICLES, METHOD FOR PREPARING THE SAME AND DISPLAY DEVICE THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Zhiqing Shi, Guangdong (CN); Jinyang Zhao, Guangdong (CN); Lixuan Chen, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 652 days.

(21) Appl. No.: 17/905,256

(22) PCT Filed: Aug. 1, 2022

(86) PCT No.: PCT/CN2022/109484
§ 371 (c)(1),
(2) Date: Aug. 29, 2022

(87) PCT Pub. No.: WO2024/011675
PCT Pub. Date: Jan. 18, 2024

(65) Prior Publication Data
US 2024/0224558 A1    Jul. 4, 2024

(30) Foreign Application Priority Data
Jul. 11, 2022  (CN) .......................... 202210812585.1

(51) Int. Cl.
*H10K 50/115*    (2023.01)
*B82Y 20/00*    (2011.01)
(Continued)

(52) U.S. Cl.
CPC .......... *H10K 50/115* (2023.02); *C09K 11/025* (2013.01); *H10K 71/12* (2023.02);
(Continued)

(58) Field of Classification Search
CPC ...... H10K 50/115; H10K 50/16; H10K 50/11; H10K 59/35; H10K 71/00; H10K 85/654;
(Continued)

(56) References Cited

U.S. PATENT DOCUMENTS 10,096,469 B2 *  10/2018  Bhatti .............. H01L 21/02557
10,985,336 B1 *   4/2021  Hamilton ............. H10K 50/115
(Continued)

FOREIGN PATENT DOCUMENTS

CN  107507901 A  12/2017
CN  107603339 A   1/2018
(Continued)

OTHER PUBLICATIONS

Chinese Office Action issued in corresponding Chinese Patent Application No. 202210812585.1 dated Feb. 22, 2025, pp. 1-8.
(Continued)

*Primary Examiner* — Caleb E Henry
(74) *Attorney, Agent, or Firm* — PV IP PC; Peter S. Stecher; Wei Te Chung

(57) ABSTRACT

A quantum dot substrate, a method for preparing the same, and a display device thereof. The quantum dot substrate includes a quantum dot film. The quantum dot film includes a plurality of quantum dots and a plurality of first nanoparticles dispersed among the plurality of quantum dots. A particle size of the plurality of first nanoparticles ranges
(Continued)

from 2 nanometers (nm) to 50 nm. In the present application, a self-absorption phenomenon of the plurality of quantum dots is reduced and luminous efficiency of the plurality of quantum dots is enhanced through arranging the plurality of first nanoparticles with particle sizes ranging from 2 nm to 50 nm among the plurality of quantum dots.

16 Claims, 5 Drawing Sheets

(51) Int. Cl.
  *B82Y 40/00* (2011.01)
  *C09K 11/02* (2006.01)
  *H10K 59/12* (2023.01)
  *H10K 71/12* (2023.01)
  *H10K 102/00* (2023.01)

(52) U.S. Cl.
  CPC .............. *B82Y 20/00* (2013.01); *B82Y 40/00* (2013.01); *H10K 59/12* (2023.02); *H10K 2102/311* (2023.02)

(58) Field of Classification Search
  CPC ......... H10K 2101/40; H10K 2102/331; H10K 50/165; H10K 50/15; H10K 71/12; H10K 71/15; H10K 59/12; H10K 2102/311; C09K 11/025; B82Y 20/00; B82Y 40/00; B82Y 30/00; H10H 29/142; H10H 20/8512
  See application file for complete search history.

(56) References Cited

U.S. PATENT DOCUMENTS

| | | | | |
|---|---|---|---|---|
| 11,309,508 | B2* | 4/2022 | Zhuang | G02B 5/0294 |
| 2010/0140586 | A1* | 6/2010 | Char | C01G 11/00 257/14 |
| 2015/0083991 | A1 | 3/2015 | Tang | |
| 2015/0334805 | A1* | 11/2015 | Gandhi | H10K 30/821 313/499 |
| 2018/0119007 | A1* | 5/2018 | Ippen | H10K 50/115 |
| 2018/0175319 | A1* | 6/2018 | Thompson | H10K 50/82 |
| 2018/0254421 | A1* | 9/2018 | Kinge | H10K 50/115 |
| 2019/0011782 | A1* | 1/2019 | Pickett | C09K 11/883 |
| 2019/0348623 | A1* | 11/2019 | Dohner | H10K 71/40 |
| 2020/0067006 | A1* | 2/2020 | Ippen | H10K 50/15 |
| 2020/0271996 | A1* | 8/2020 | Steinhagen | C09K 11/883 |
| 2020/0299575 | A1* | 9/2020 | Ippen | C09K 11/565 |
| 2021/0088815 | A1* | 3/2021 | Park | G09G 3/30 |
| 2021/0159436 | A1* | 5/2021 | Zhuang | G02B 5/0294 |
| 2021/0183999 | A1* | 6/2021 | Kwon | H10H 20/818 |
| 2021/0269709 | A1* | 9/2021 | Choi | H10H 20/8512 |
| 2021/0324268 | A1* | 10/2021 | Yang | G02B 6/005 |
| 2022/0199924 | A1* | 6/2022 | Kobashi | G09F 9/33 |
| 2022/0199925 | A1* | 6/2022 | Kobashi | H10K 50/115 |
| 2022/0204844 | A1* | 6/2022 | Won | C01B 19/007 |

FOREIGN PATENT DOCUMENTS

| | | |
|---|---|---|
| CN | 110047903 A | 7/2019 |
| CN | 111808603 A | 10/2020 |
| CN | 112210366 A | 1/2021 |
| CN | 113130756 A | 7/2021 |
| CN | 113254849 A | 8/2021 |
| CN | 114122273 A | 3/2022 |
| CN | 114350363 A | 4/2022 |
| CN | 114488615 A | 5/2022 |

OTHER PUBLICATIONS

International Search Report in International application No. PCT/CN2022/109484, mailed on Dec. 26, 2022.
Written Opinion of the International Search Authority in International application No. PCT/CN2022/109484, mailed on Dec. 26, 2022.

* cited by examiner

QUANTUM DOT SUBSTRATE INCLUDING NANOPARTICLES, METHOD FOR PREPARING THE SAME AND DISPLAY DEVICE THEREOF

FIELD OF DISCLOSURE

The present disclosure relates to the field of display technology, and more particularly, to a quantum dot substrate, a display device thereof, and a method for preparing the same.

BACKGROUND OF DISCLOSURE

A quantum dot (QD) is a nanoscale semiconductor material. QD has a quantum fluorescence effect, i.e., being capable of emitting fluorescence of different colors under an excitation of electricity or light. QD materials can provide a display a wider color gamut, making a terminal display have a more beautiful color performance.

In conventional products with QD films, due to small distances among QDs inside the QD films, a self-absorption phenomenon of the QDs is likely to occur, thereby reducing the luminous efficiency of the QD films and greatly limiting applications of the QD films.

SUMMARY

The present application provides a quantum dot substrate, a method for preparing the same, and a display device thereof, so as to reduce a self-absorption phenomenon of a plurality of quantum dots (QDs) in a QD film.

The present application provides a quantum dot substrate including a quantum dot film, wherein the quantum dot film includes a plurality of quantum dots and a plurality of first nanoparticles dispersed among the plurality of quantum dots, and a particle size of the plurality of first nanoparticles ranges from 2 nanometers (nm) to 50 nm.

Optionally, in some embodiments of the present application, the particle size of the plurality of first nanoparticles ranges from 10 nm to 20 nm.

Optionally, in some embodiments of the present application, the quantum dot film further includes a plurality of second nanoparticles dispersed among the plurality of quantum dots, and a particle size of the plurality of second nanoparticles is greater than the particle size of the plurality of first nanoparticles.

Optionally, in some embodiments of the present application, the particle size of the plurality of second nanoparticles ranges from 300 nm to 500 nm.

Optionally, in some embodiments of the present application, the plurality of first nanoparticles and the plurality of second nanoparticles include same surface modification ligands.

Optionally, in some embodiments of the present application, a ratio of a mass percentage of the plurality of first nanoparticles and the plurality of second nanoparticles in the quantum dot film to a mass percentage of the plurality of quantum dots in the quantum dot film ranges from 1:50 to 1:10.

Optionally, in some embodiments of the present application, a mass percentage of the plurality of first nanoparticles in the quantum dot film is greater than a mass percentage of the plurality of second nanoparticles in the quantum dot film.

Optionally, in some embodiments of the present application, a ratio of the mass percentage of the plurality of first nanoparticles in the quantum dot film to the mass percentage of the plurality of second nanoparticles in the quantum dot film ranges from 5:1 to 20:1.

Optionally, in some embodiments of the present application, the plurality of first nanoparticles include one or more of silicon dioxide, titanium oxide, zirconium oxide, tungsten oxide, zinc oxide, or barium titanate.

Optionally, in some embodiments of the present application, the quantum dot substrate further includes a base and a conductive layer disposed on the base, and the quantum dot film is disposed on a side of the conductive layer away from the base.

Optionally, in some embodiments of the present application, the conductive layer includes a first conductive electrode and a second conductive electrode, a pattern of the first conductive electrode and a pattern of the second conductive electrode are matched to each other, the quantum dot film covers one of the first conductive electrode and the second conductive electrode, and a pattern of the quantum dot film is same as one of the pattern of the first conductive electrode and the pattern of the second conductive electrode.

The present application provides a display device including the quantum dot substrate described in any one of the embodiments mentioned above.

The present application further provides a method for preparing a quantum dot substrate including the following steps:

providing a base, wherein a conductive layer is formed on the base;

providing a quantum dot mixture, wherein the quantum dot mixture includes a plurality of quantum dots and a plurality of first nanoparticles, and a particle size of the plurality of first nanoparticles ranges from 2 nanometers (nm) to 50 nm;

depositing the quantum dot mixture on the conductive layer; and curing the quantum dot mixture to form a quantum dot film and dispensing the plurality of first nanoparticles among the plurality of quantum dots.

Optionally, in some embodiments of the present application, a step of providing the quantum dot mixture includes:

providing the plurality of first nanoparticles, a surface modifier, and an additive;

dispersing the plurality of first nanoparticles in the surface modifier to obtain a plurality of surface-modified first nanoparticles;

dispersing the plurality of surface-modified first nanoparticles in the additive to form a first nanoparticle dispersion;

providing a quantum dot colloid solution and mixing the first nanoparticle dispersion with the quantum dot colloid solution to form the quantum dot mixture.

Optionally, in some embodiments of the present application, a mass of the surface modifier is 20% to 60% of a mass of the plurality of first nanoparticles.

Optionally, in some embodiments of the present application, before a step of dispersing the plurality of first nanoparticles in the surface modifier, surfaces of the plurality of first nanoparticles has hydroxyl groups, and the surface modifier includes carboxyl-containing or amino-containing polyethylene glycol, polyethylene adipate, or silane coupling agents.

Compared with a conventional quantum dot substrate, the quantum dot substrate provided by the present application adds the plurality of first nanoparticles in the quantum dot film, and the particle size of the plurality of first nanoparticles ranges from 2 nm to 50 nm. Within a range of the particle size mentioned above, since a Brownian motion of the plurality of first nanoparticles is relatively strong, the plurality of first nanoparticles can be efficiently dispersed among the plurality of quantum dots, thereby increasing distances among the plurality of quantum dots, weakening the self-absorption phenomenon of the plurality of quantum dots, and enhancing a luminous efficiency of the quantum dot film.

BRIEF DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF PRESENT EMBODIMENTS

Figure 1:
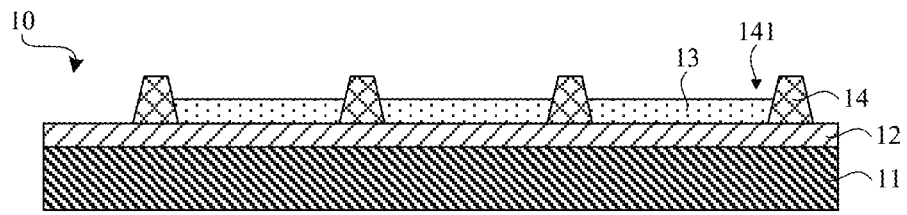
FIG. 1 is a structural schematic view of a quantum dot substrate provided by a first embodiment of the present application.

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

In the prior art, processing methods of quantum dot films are usually photolithography or inkjet printing. However, the quantum dot films prepared by two methods mentioned above have problems of low luminous efficiency and poor stability, and the processing methods mentioned above also have disadvantages such as poor repeatability and long processing time. For example, the quantum dot films prepared by photolithography have low luminous efficiency, and photoresist is required for preparing the quantum dot film by photolithography, which leads to a high cost for preparing the quantum dot films by photolithography; the inkjet printing method does not facilitate achieving of high-resolution display due to equipment limitations, and so on. Preparing the quantum dot films through an electrophoretic deposition method is to utilize charged quantum dot material that move in a specific direction under an action of an electric field, and selectively deposit quantum dots under a specific electrode. Preparing the quantum dot films through the electrophoretic deposition method can not only achieve the high resolution display, but also increase value of application of the quantum dot films in the field of high-resolution display. Although the electrophoretic deposition method has characteristics of being convenience and speed, the electrophoretic deposition method has not been applied to a preparation process of the quantum dot films in a large scale.

The inventors of the present application have found in a large amount of experiments that, for the quantum dot films prepared through the electrophoretic deposition method, after the quantum dot films are formed, a solvent in quantum dot colloid solution volatilizes, resulting in quantum dots in the quantum dot films having a relatively high ratio, and distances among the quantum dots being small, which causes the quantum dots to be occurred with severe self-absorption phenomenon, thereby reducing luminous efficiency of the quantum dot films.

In view of technical problems mentioned above that exist in the prior art, embodiments of the present application provide a quantum dot substrate, a method for preparing the same, and a display device thereof. each of which will be described in detail below.

The present application provides a quantum dot substrate including a quantum dot film. The quantum dot film includes a plurality of quantum dots and a plurality of first nanoparticles dispersed among the plurality of quantum dots, and a particle size of the plurality of first nanoparticles ranges from 2 nanometers (nm) to 50 nm.

Therefore, in the quantum dot substrate provided by the present application, the plurality of first nanoparticles are added in the quantum dot film, and the particle size of the plurality of first nanoparticles ranges from 2 nm to 50 nm. Within a range of the particle size mentioned above, a Brownian motion of the plurality of first nanoparticles is relatively strong and can therefore be efficiently dispersed among the plurality of quantum dots, so that distances among the plurality of quantum dots can be increased, the self-absorption phenomenon of the plurality of quantum dots can be weakened, and thereby enhancing the luminous efficiency of the quantum dot film.

The quantum dot substrate provided by the present application will be described in detail below through specific embodiments. It should be noted that a description order of the following embodiments is not intended to limit a preferred order of the embodiments.

Figure 2:
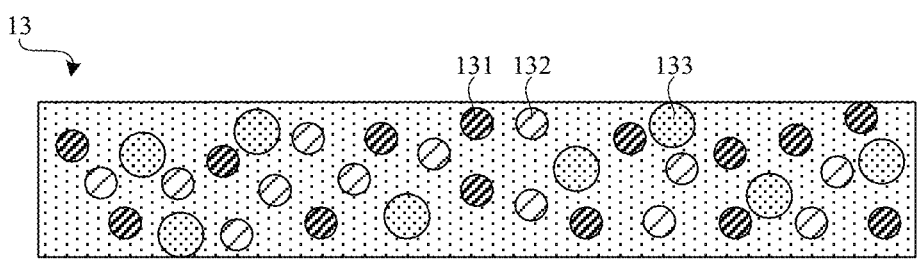
FIG. 2 is a structural schematic view of a quantum dot film in the quantum dot substrate provided by the first embodiment of the present application.

Referring to FIG. 1 and FIG. 2, a first embodiment of the present application provides a quantum dot substrate 10. The quantum dot substrate 10 includes a base 11, a conductive layer 12, and a quantum dot film 13. The conductive layer 12 is disposed on the base 11. The quantum dot film 13 is disposed on a side of the conductive layer 12 away from the base 11.

It should be noted that, in this embodiment, the base 11 is an array substrate, and a specific structure of the array substrate can refer to the prior art, which will not be reiterated herein. In some embodiments, the base 11 can also be a flexible layer, and a material of the flexible layer can be polyimide, polyethylene terephthalate, polycarbonate, polyethylene naphthalate, polyethylene ether sulfone, polyarylate, etc., and are not specifically limited herein.

The conductive layer 12 is disposed on a surface of the base 11. A material of the conductive layer 12 can include one or more of metals, alloys, and metal oxides. Metals can include one or more of copper, silver, molybdenum, and aluminum, alloys can be an alloy composed of any two or more of afore-mentioned metals, such as silver-aluminum alloy, molybdenum-aluminum alloy, etc., and metal oxide can include titanium oxide, indium tin oxide, etc.

It should be noted that the conductive layer 12 in the present application can be a whole-surface structure or a patterned structure, and a specific structure of the conductive layer 12 can be arranged according to actual applications, which is not limited in the present application.

In this embodiment, the quantum dot substrate 10 can further include a blocking portion 14. The blocking portion 14 is disposed on the side of the conductive layer 12 away from the base 11. The blocking portion 14 defines a plurality of openings 141. One of the plurality of openings 141 can correspond to a light-emitting unit (not shown in the figures) in the quantum dot substrate 10, and the light-emitting unit can be an organic light-emitting diode, a mini-light-emitting diode, or a micro-light-emitting diode. The quantum dot film 13 is disposed in an opening 141.

It should be noted that, in some embodiments, when a whole-surface of the quantum dot film 13 is required to be arranged, an arrangement of the blocking portion 14 can also be omitted, and this embodiment should not be construed as a limitation to the present application.

In this embodiment, the quantum dot film 13 and the conductive layer 12 have a same pattern. The quantum dot film 13 includes a plurality of quantum dots 131 and a plurality of first nanoparticles 132 dispersed among the plurality of quantum dots 131.

Specifically, a particle size of the plurality of quantum dots 131 ranges from 1 nm to 15 nm. The plurality of quantum dots 131 are composed of group IV, II-VI, IV-VI, or III-V elements, specifically, the plurality of quantum dots 131 are mainly composed of group IVA, IIB-VIA, IIIA-VA, or IVA-VIA elements. For example, when the plurality of quantum dots 131 are composed of group IVA elements, the plurality of quantum dots 131 can include carbon quantum dots, silicon quantum dots, or germanium quantum dots. When the plurality of quantum dots 131 are composed of group IIB-VIA elements, the plurality of quantum dots 131 can specifically include cadmium selenide quantum dots, zinc sulfide quantum dots, or cadmium sulfide quantum dots. When the plurality of quantum dots 131 are composed of group IIIA-VA elements, the plurality of quantum dots 131 can specifically include indium phosphide quantum dots, gallium arsenide quantum dots, or indium arsenide quantum dots. When the plurality of quantum dots 131 are composed of group IVA-VIA elements, the plurality of quantum dots 131 can specifically include lead sulfide quantum dots, lead selenide quantum dots, or lead telluride quantum dots. A specific material of the plurality of quantum dots 131 can be selected according to actual applications, which is not limited in the present application.

A particle size of the plurality of first nanoparticles 132 ranges from 2 nm to 50 nm. Within a range of the particle size mentioned above, a Brownian motion of the plurality of first nanoparticles 132 is relatively strong and can therefore be efficiently dispersed among the plurality of quantum dots 131, so that distances among the plurality of quantum dots 131 can be increased, a self-absorption phenomenon of the plurality of quantum dots 131 can be weakened, and thereby enhancing luminous efficiency of the quantum dot film 13. In some embodiments, the particle size of the plurality of first nanoparticles 132 is 2 nm, 5 nm, 10 nm, 15 nm, 20 nm, 25 nm, 30 nm, 35 nm, 40 nm, 45 nm, or 50 nm.

Furthermore, in this embodiment, the particle size of the plurality of first nanoparticles 132 ranges from 10 nm to 20 nm. Within a range of the particle size mentioned above, the Brownian motion of the plurality of first nanoparticles 132 is intensified, and the distances among the plurality of quantum dots 131 can be further increased, so that the self-absorption phenomenon of the plurality of quantum dots 131 can be further weakened. In some embodiments, the particle size of the plurality of first nanoparticles 132 is 10 nm, 11 nm, 12 nm, 13 nm, 14 nm, 15 nm, 16 nm, 17 nm, 18 nm, 19 nm, or 20 nm.

Preferably, the particle size of the plurality of first nanoparticles 132 is same as the particle size of the plurality of quantum dots 131, such as 3 nm, 5 nm, 8 nm, 10 nm, 12 nm, or 15 nm. On one hand, an arrangement mentioned above can prevent agglomeration from occurring due to the particle size of the plurality of first nanoparticles 132 being too small, and can enhance a dispersity of the plurality of first nanoparticles 132 among the plurality of quantum dots 131; on the other hand, the arrangement mentioned above can also prevent the luminous efficiency of the quantum dot film 13 from being affected by the particle size of the plurality of first nanoparticles 132 being too large.

Specifically, the plurality of first nanoparticles 132 include one or more of silicon dioxide, titanium oxide, zirconium oxide, tungsten oxide, zinc oxide, and barium titanate. In this embodiment, the plurality of first nanoparticles 132 are silicon dioxide.

Furthermore, in this embodiment, the quantum dot film 13 further includes a plurality of second nanoparticles 133. The plurality of second nanoparticles 133 are dispersed among the plurality of quantum dots 131. A particle size of the plurality of second nanoparticles 133 is larger than the particle size of the plurality of first nanoparticles 132. Therefore, in this embodiment, by introducing the plurality of second nanoparticles 133 into the quantum dot film 13, compared with the plurality of first nanoparticles 132, when the plurality of second nanoparticles 133 with larger particle sizes are dispersed among the plurality of quantum dots 131, an optical path of light in the quantum dot film 13 is increase, so that light extraction rate of the quantum dot film 13 can be increased, and blue light transmittance of the quantum dot film 13 can be reduced, thereby reducing blue light transmittance of the quantum dot substrate 10.

The particle size of the plurality of second nanoparticles 133 ranges from 300 nm to 500 nm. Within a range mentioned above, the light extraction rate of the quantum dot film 13 can be further increased, and the blue light transmittance of the quantum dot film 13 can be further reduced. In some specific embodiments, the particle size of the plurality of second nanoparticles 133 is 300 nm, 325 nm, 350 nm, 375 nm, 400 nm, 425 nm, 450 nm, 475 nm, or 500 nm.

Specifically, the plurality of second nanoparticles 133 include one or more of silicon dioxide, titanium oxide, zirconium oxide, tungsten oxide, zinc oxide, and barium titanate. In this embodiment, a material of the plurality of second nanoparticles 133 is same as a material of the plurality of first nanoparticles 132, and both are silicon dioxide, so as to enhance a compatibility between materials. It should be noted that, in some embodiments, the material of the plurality of second nanoparticles 133 and the material of the plurality of first nanoparticles 132 can also be different, and details are not reiterated herein.

Furthermore, the plurality of first nanoparticles 132 and the plurality of second nanoparticles 133 include same surface modification ligands, and the surface modification ligands can be polar groups. The arrangement mentioned above can increase a dispersity of the plurality of second nanoparticles 133 among the plurality of first nanoparticles 132 and prevent the agglomeration among nanoparticles from occurring.

Specifically, the plurality of first nanoparticles 132 and the plurality of second nanoparticles 133 are both formed through surface modification. Through the surface modification: firstly, steric hindrance of the plurality of first nanoparticles 132 and the plurality of second nanoparticles 133 is increased, thereby reducing an aggregation probability among the plurality of first nanoparticles 132, an aggregation probability among the plurality of second nanoparticles 133, and an aggregation probability among the plurality of first nanoparticles 132 and the plurality of second nanoparticles 133, so as to increase the dispersity of the plurality of first nanoparticles 132 and the dispersity of the plurality of second nanoparticles 133 in the quantum dot film 13; secondly, a zeta potential of the plurality of first nanoparticles 132 and a zeta potential of the plurality of second nanoparticles 133 are both increased, which can enhance a stability of the plurality of first nanoparticles 132 and a stability of the plurality of second nanoparticles 133 in the quantum dot film 13; and thirdly, after the surface modification, due to an introduction of the polar groups on surfaces of the plurality of first nanoparticles 132 and surfaces of the plurality of second nanoparticles 133, the polar groups can ionize more charges, so that the surfaces of the plurality of first nanoparticles 132 and the surfaces of the plurality of second nanoparticles 133 do not easily aggregate due to repulsive forces generated among the charges, which further facilitates the plurality of first nanoparticles 132 and the plurality of second nanoparticles 133 to disperse in the quantum dot film 13.

In this embodiment, a ratio of a sum of a mass percentage of the plurality of first nanoparticles 132 and the plurality of second nanoparticles 133 in the quantum dot film 13 to a mass percentage of the plurality of quantum dots 131 in the quantum dot film 13 ranges from 1:50 to 1:10. Compared with the plurality of first nanoparticles 132 and the plurality of second nanoparticles 133, the plurality of quantum dots 131 have a relatively high mass percentage in the quantum dot film 13, which can not only ensure a film thickness of the quantum dot film 13, but also ensure the luminous efficiency of the quantum dot film 13 and the luminous efficiency of the quantum dot film 13 is prevented from being affected due to excessive addition of the plurality of first nanoparticles 132 and the plurality of second nanoparticles 133. In some specific embodiments, the ratio of the sum of the mass percentage of the plurality of first nanoparticles 132 and the plurality of second nanoparticles 133 in the quantum dot film 13 to the mass percentage of the plurality of quantum dots 131 in the quantum dot film 13 can be 1:50, 1:45, 1:40, 1:35, 1:30, 1:25, 1:20, 1:15 or 1:10.

It should be noted that "mass percentage" in this application refers to a mass ratio of a certain material in the quantum dot film 13 in the entire quantum dot film 13. Specifically, a mass percentage of the plurality of first nanoparticles 132 in the quantum dot film 13 refers to a ratio of mass of the plurality of first nanoparticles 132 in the quantum dot film 13; a mass percentage of the plurality of second nanoparticles 133 in the quantum dot film 13 refers to a ratio of mass of the plurality of second nanoparticles 133 in the quantum dot film 13; and the mass percentage of the plurality of quantum dots 131 in the quantum dot film 13 refers to a ratio of mass of the plurality of quantum dots 131 in the quantum dot film 13.

Furthermore, in this embodiment, the mass percentage of the plurality of first nanoparticles 132 in the quantum dot film 13 is greater than the mass percentage of the plurality of second nanoparticles 133 in the quantum dot film 13. The arrangement mentioned above can enhance the dispersity of the plurality of second nanoparticles 133 in the quantum dot film 13, so that the plurality of second nanoparticles 133 can be uniformly dispersed among the plurality of quantum dots 131 and among the plurality of first nanoparticles 132, thereby facilitating an increase of an amount of reflection interfaces and refraction interfaces of light in the quantum dot film 13, which can further reduce the blue light transmittance of the quantum dot film 13, thereby further reducing the blue light transmittance of the quantum dot substrate 10.

The ratio of the mass percentage of the plurality of first nanoparticles 132 to the mass percentage of the plurality of second nanoparticles 133 in the quantum dot film 13 ranges from 5:1 to 20:1. In some specific embodiments, the ratio of the mass percentage of the plurality of first nanoparticles 132 to the mass percentage of the plurality of second nanoparticles 133 in the quantum dot film 13 can be 5:1, 6:1, 7:1, 8:1, 9:1, 10:1, 11:1, 12:1, 13:1, 14:1, 15:1, 16:1, 17:1, 18:1, 19:1, or 20:1.

In sum, in the quantum dot substrate 10 provided by the first embodiment of the present application, the plurality of first nanoparticles 132 and the plurality of second nanoparticles 133 are added to the quantum dot film 13. On one hand, the plurality of first nanoparticles 132 and the plurality of second nanoparticles 133 with the particle sizes ranging from 2 nm to 50 nm have a strong Brownian motion among one another, which can be efficiently dispersed among the plurality of quantum dots 131, so as to increase the distances among the plurality of quantum dots 131 and weaken the self-absorption phenomenon of the plurality of quantum dots 131, so that the luminous efficiency of the quantum dot film 13 can be enhanced. On the other hand, an addition of the plurality of second nanoparticles 133 can enhance the light extraction rate of the quantum dot film 13, thereby reducing the blue light transmittance of the quantum dot film 13, so as to reduce the blue light transmittance of the quantum dot substrate 10.

Figure 3:
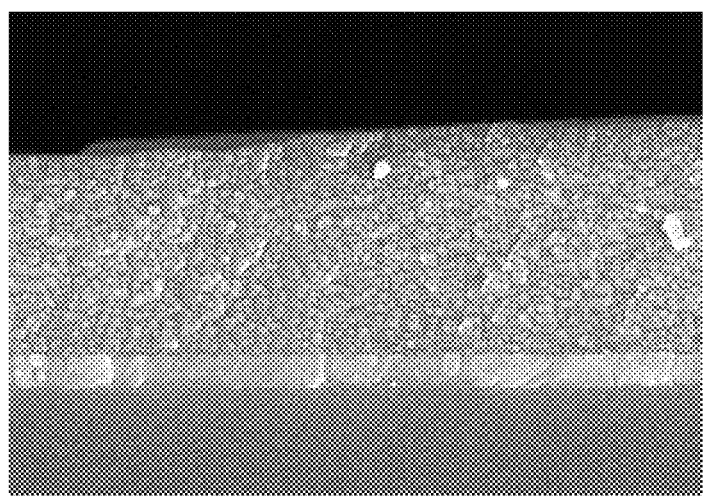
FIG. 3 is a schematic view from a scanning electron microscope of a quantum dot film in a quantum dot substrate provided by a comparative embodiment provided of the present application.
Figure 4:
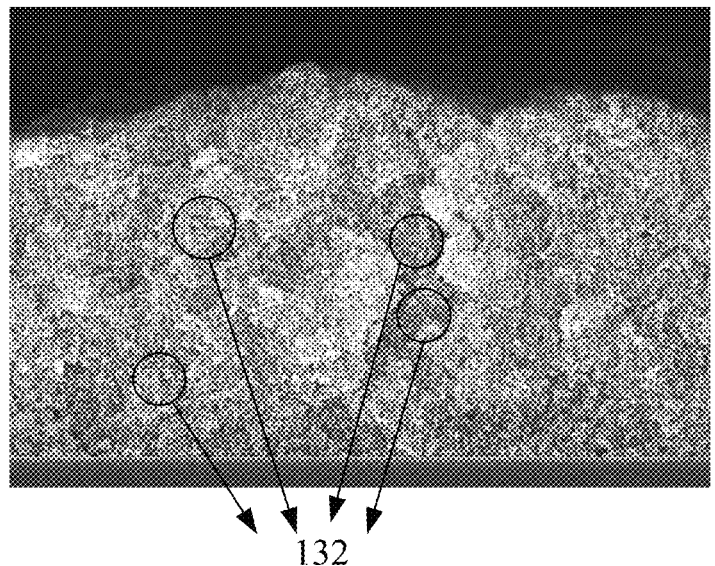
FIG. 4 is a schematic view from a scanning electron microscope of a quantum dot film in a quantum dot substrate provided by a first embodiment of the present application.
Figure 5:
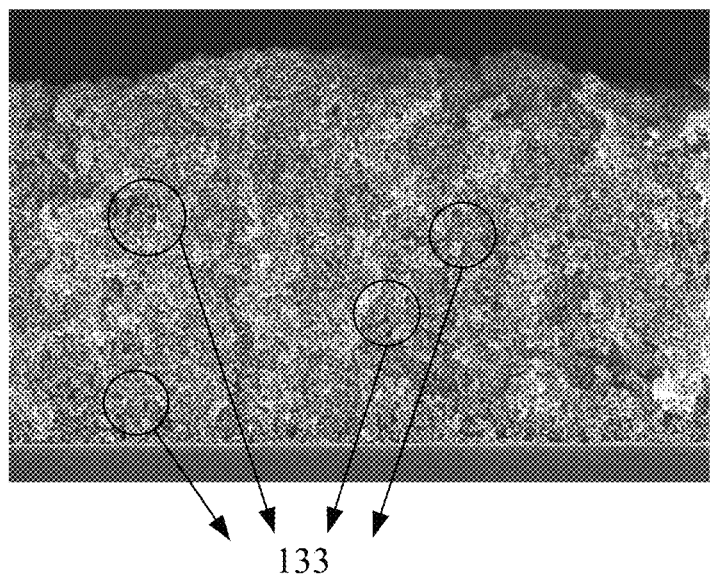
FIG. 5 is a schematic view of a scanning electron microscope of a quantum dot film in a quantum dot substrate provided by a second embodiment of the present application.

Referring to FIG. 3 to FIG. 5 and Table 1, the quantum dot film 13 without adding the plurality of first nanoparticles 132 and the plurality of second nanoparticles 133 (hereinafter referred to as "comparative exemplary embodiment"), the quantum dot film 13 only added with the plurality of first nanoparticles 132 (hereinafter referred to as "first exemplary embodiment"), and the quantum dot film 13 added with both the plurality of first nanoparticles 132 and the plurality of second nanoparticles 133 (hereinafter referred to as "second exemplary embodiment") are measured in the present application, and corresponding schematic views of scanning electron microscope, light energy conversion rate, and blue light transmittance of the quantum dot film 13 of the comparative exemplary embodiment, the first exemplary embodiment, and the second exemplary embodiment are measured, respectively. In the comparative exemplary embodiment, the first exemplary embodiment, and the second exemplary embodiment, particle sizes of the plurality of quantum dots 131 are all the same, and the particle size of the plurality of first nanoparticles 132 in the first exemplary embodiment and the second exemplary embodiment are the same. Relevant experimental measurement conditions are: the particle size of the plurality of quantum dots 131 is 12 nm, the particle size of the plurality of first nanoparticles 132 is 12 nm, the particle size of the plurality of second nanoparticles 133 is 400 nm, blue light is used as an excitation light, and the plurality of quantum dots 131 are a plurality of red quantum dots 131, so as to measure the light energy conversion rate and the blue light transmittance of the quantum dot film 13.

TABLE 1

| | QDs (particle size/nm) | First Nano-particle (particle size/nm) | Second Nano-particle (particle size/nm) | Light energy conversion rate (%) | Blue light transmittance (%) |
| --- | --- | --- | --- | --- | --- |
| Comparative Ex. | 12 | | | 26.8 | 32.1 |
| First Ex. | 12 | 12 | | 57.1 | 24.4 |
| Second Ex. | 12 | 12 | 400 | 57.1 | 16.9 |

It can be seen that, compared with the comparative exemplary embodiment without the plurality of first nanoparticles 132, with reference to FIG. 3, FIG. 4, and Table 1, in the first exemplary embodiment, since the plurality of first nanoparticles 132 are added to the quantum dot film 13, the distances among the plurality of quantum dots 131 are significantly increased, so that the light energy conversion rate of the quantum dot film 13 is increased, and the light energy conversion rate is increased from 26.8% to 57.1%. Therefore, in the present application, through adding the plurality of first nanoparticles 132 in the quantum dot film 13, the luminous efficiency of the quantum dot film 13 can be greatly increased. Furthermore, in the second exemplary embodiment, referring to FIG. 4, FIG. 5, and Table 1, after adding the plurality of second nanoparticles 133 in the quantum dot film 13, the plurality of second nanoparticles 133 are dispersed among the plurality of quantum dots 131, so that the blue light transmittance of the plurality of quantum dots film 13 is significantly reduced.

Therefore, in this embodiment, it can be verified that through adding the plurality of first nanoparticles 132 to the quantum dot film 13, the self-absorption phenomenon of the plurality of quantum dots 131 can be weakened and the luminous efficiency of the quantum dot film 13 can be enhanced. In addition, the addition of the plurality of second nanoparticles 133 can increase the light extraction rate of the quantum dot film 13, and the blue light transmittance of the quantum dot film 13 can be reduced.

Figure 6:
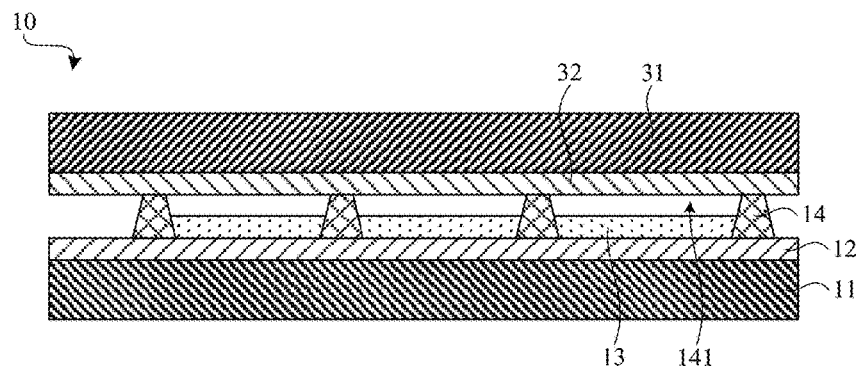
FIG. 6 is a structural schematic view of a quantum dot substrate provided by a second embodiment of the present application.

Referring to FIG. 6, a second embodiment of the present application provides a quantum dot substrate 10. Differences of the quantum dot substrate 10 provided in the second embodiment and the quantum dot substrate 10 provided in the first embodiment of the present application is that the quantum dot substrate 10 further includes a top substrate 31 and a conductive electrode 32, and the conductive electrode 32 is disposed on a side of the top substrate 31 adjacent to the quantum dot film 13.

Electrical properties of the plurality of quantum dots 131 are same as the plurality of quantum dots 131 of the plurality of first nanoparticles 132 and the plurality of second nanoparticles 133, and charged particles mentioned above are all positively charged or negatively charged. When a voltage is applied to the conductive layer 12 and the conductive electrode 32, one of the conductive layer 12 and the conductive electrode 32 is a positive electrode, the other one is a negative electrode, and the quantum dot film 13 is formed on an electrode that is oppositely charged.

In this embodiment, the charged particles in the quantum dot film 13 are negatively charged, and when a voltage is applied to the conductive layer 12 and the conductive electrode 32, a vertical electric field is formed between the conductive layer 12 and the conductive electrode 32, the conductive layer 12 is a positive electrode, the conductive electrode 32 is a negative electrode, and the charged particles that are negatively charged are deposited on the conductive layer 12 to form the quantum dot film 13.

Figure 7:
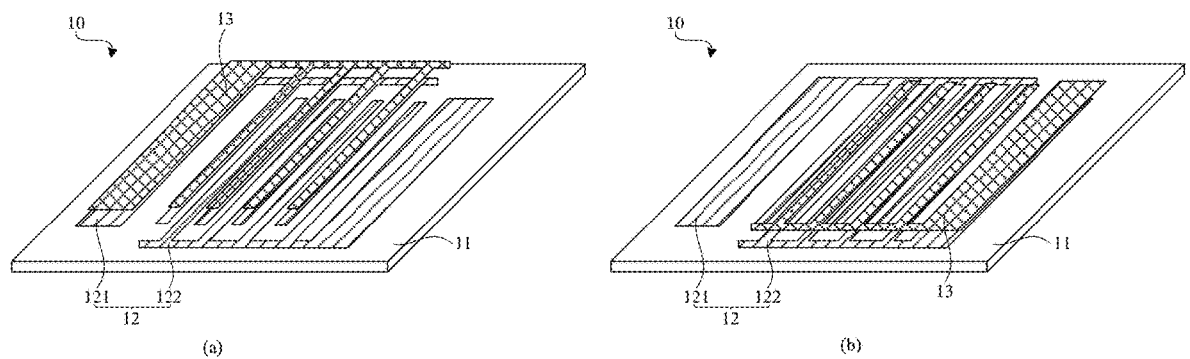
FIG. 7 is a structural schematic view of a quantum dot substrate provided by a third embodiment of the present application.
Figure 8:
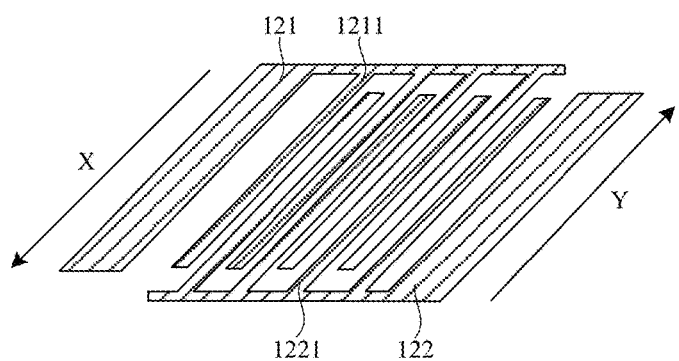
FIG. 8 is a structural schematic view of a conductive layer in the quantum dot substrate provided by the third embodiment of the present application.

Referring to FIG. 7 and FIG. 8, a third embodiment of the present application provides a quantum dot substrate 10. Differences of the quantum dot substrate 10 provided in the third embodiment of the present application and the quantum dot substrate 10 provided in the first embodiment of the present application is that the conductive layer 12 includes a first conductive electrode 121 and a second conductive electrode 122, a pattern of the first conductive electrode 121 and a pattern of the second conductive electrode 122 are matched to each other, the quantum dot film 13 covers one of the first conductive electrode 121 and the second conductive electrode 122 and a pattern of the quantum dot film 122 is same as one of the pattern of the first conductive electrode and the pattern of the second conductive electrode.

In this embodiment, the electrical properties of the plurality of quantum dots 131 are same as the electrical properties of the plurality of first nanoparticles 132 and the plurality of second nanoparticles 133, and the charged particles mentioned above are all positively charged or negatively charged. When a voltage is applied to the first conductive electrode 121 and the second conductive electrode 122, one of the first conductive electrode 121 and the second conductive electrode 122 is a positive electrode, the other one is a negative electrode, and the quantum dot film 13 is formed on an electrode that is oppositely charged.

For example, taking the charged particles in the quantum dot film 13 being negatively charges as an example, when a voltage is applied to the first conductive electrode 121 and the second conductive electrode 122, a horizontal electric field is formed between the first conductive electrode 121 and the second conductive electrode 122. If the first conductive electrode 121 is the positive electrode and the second conductive electrode 122 is the negative electrode, the charged particles that are negatively charged are deposited on the first conductive electrode 121 to form the quantum dot film 13, and the quantum dot film 13 has a same pattern as the first conductive electrode 121, as shown in (a) of FIG. 7; and if the first conductive electrode 121 is the negative electrode and the second conductive electrode 122 is the positive electrode, the charged particles that are negatively charged are deposited on the second conductive electrode 122 to form the quantum dot film 13, the quantum dot film 13 has a same pattern as the second conductive electrode 122, as shown in (b) of FIG. 7.

It should be noted that in (a) of FIG. 7, in order to reflect a relative positional relationship between the quantum dot film 13 and the first conductive electrode 121, the quantum dot film 13 is not in contact with the first conductive electrode 121. However, in an actual product structure, the quantum dot film 13 is formed on a surface of the first conductive electrode 121 and can be in contact with the surface of the first conductive electrode 121. In (b) of FIG. 7, in order to reflect a relative positional relationship between the quantum dot film 13 and the second conductive electrode 122, the quantum dot film 13 is not in contact with the second conductive electrode 122, However, in an actual product structure, the quantum dot film 13 is formed on a surface of the second conductive electrode 122 and can be in contact with the surface of the second conductive electrode 122.

Specifically, the first conductive electrode 121 can include a plurality of first strip electrodes 1211 extending along a first direction X, and the second conductive electrode 122 can include a plurality of second strip electrodes 1221 extending along a second direction Y. The first directions X and the second direction Y are parallel and in opposite direction to each other.

It should be noted that the pattern of the first conductive electrode 121 and the pattern of the second conductive electrode 122 in this embodiment are only for illustration and for facilitating the description of this embodiment, but should not be construed as limitations on this application. As long as the horizontal electric field can be ensured to form by the first conductive electrode 121 and the second conductive electrode 122 under an applied voltage, the pattern of the first conductive electrode 121 and the pattern of the second conductive electrode 122 are within a protection scope of the present application. In addition, for the convenience of describing this embodiment, a structure of the blocking portion 14 is omitted in this embodiment, but not limited thereto.

The present application further provides a display device. The display device can be any product or component with a display function, such as an electronic paper, a mobile phone, a tablet computer, a television, a monitor, a notebook computer, a digital photo frame, a navigator, etc. Specifically, the display device provided in the present application can be a liquid crystal display device, an organic light-emitting diode display device, a mini-light-emitting diode display device, or a micro-light-emitting diode display device, and the present application does not limit a specific type of the display device.

Figure 9:
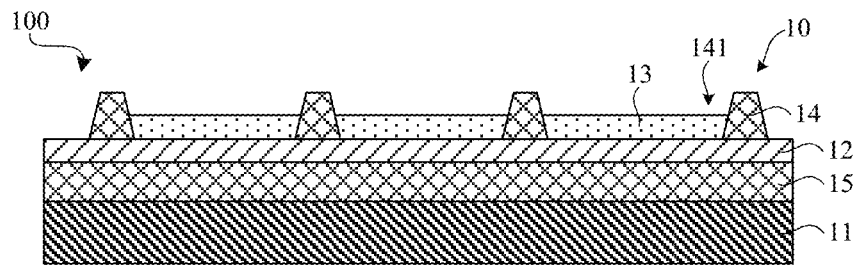
FIG. 9 is a structural schematic view of a display device provided by the present application.

Referring to FIG. 9, the display device 100 provided by the present application includes a quantum dot substrate. The quantum dot substrate can be the quantum dot substrate 10 described in the first embodiment or the second embodiment mentioned above. The present application only takes a structure of the quantum dot substrate 10 described in the first embodiment as an example, but is not limited thereto.

Furthermore, the display device 100 can further include a light-emitting layer 15, and the light-emitting layer 15 can include a plurality of light-emitting diodes (not shown in the figures), and the plurality of light-emitting diodes can be mini-light-emitting diodes or micro-light-emitting diodes, and related structures are all existing technologies, which will not be reiterated herein.

Figure 10:
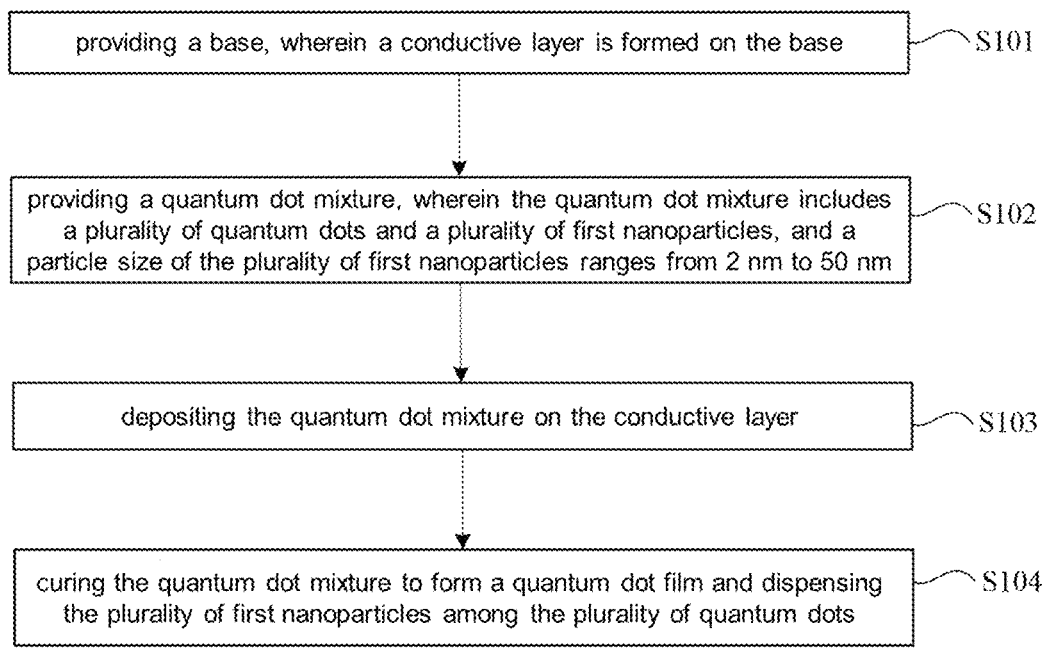
FIG. 10 is a schematic flowchart of a method for preparing a quantum dot substrate provided by the present application.

Referring to FIG. 10, the present application provides a method for preparing a quantum dot substrate, which includes the following steps:

Step S101: providing a base, wherein a conductive layer is formed on the base;

Step S102: providing a quantum dot mixture, wherein the quantum dot mixture includes a plurality of quantum dots and a plurality of first nanoparticles, and a particle size of the plurality of first nanoparticles ranges from 2 nm to 50 nm;

Step S103: depositing the quantum dot mixture on the conductive layer; and

Step S104: curing the quantum dot mixture to form a quantum dot film and dispensing the plurality of first nanoparticles among the plurality of quantum dots.

Therefore, in the method for preparing the quantum dot substrate provided by the present application, through adding the plurality of first nanoparticles with a particle size ranging from 2 nm to 50 nm in the quantum dot mixture, a Brownian motion of the plurality of first nanoparticles within the range of the particle size mentioned above is relatively strong and can therefore be efficiently dispersed among the plurality of quantum dots, so that distances among the plurality of quantum dots can be increased, the self-absorption phenomenon of the plurality of quantum dots can be weakened, and thereby enhancing a luminous efficiency of the quantum dot film.

Figure 11:
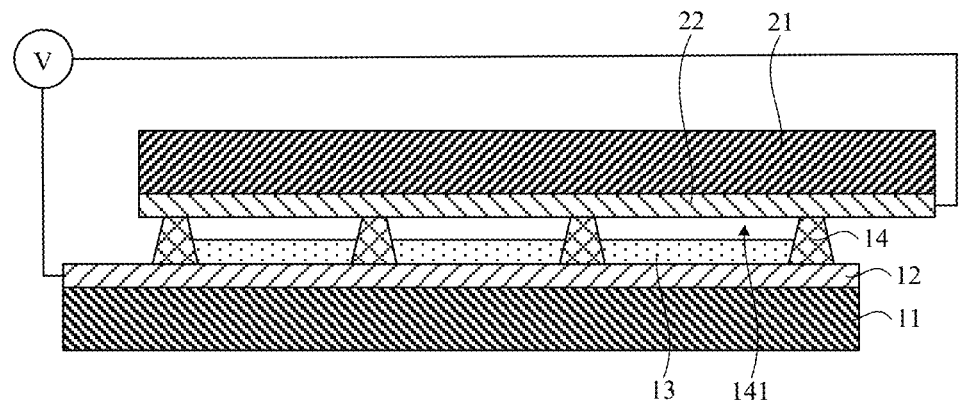
FIG. 11 is a structural schematic view of preparing the quantum dot film under a vertical electric field in the method for preparing the quantum dot substrate provided by the present application.
Figure 12:
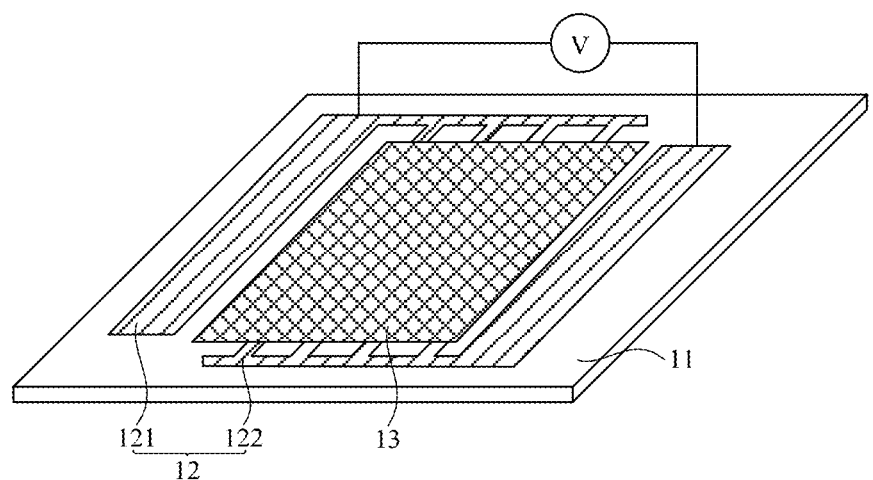
FIG. 12 is a structural schematic view of preparing the quantum dot film under a horizontal electric field in the method for preparing the quantum dot substrate provided by the present application.

References are made to FIGS. 10-12 in conjunction. The preparation method of the quantum dot substrate provided by the present application in detail are described through specific embodiments in the following.

Step S101: providing a base 11, wherein a conductive layer 12 is formed on the base 11.

The base 11 is an array substrate, and a specific structure of the array substrate can refer to the prior art, which will not be reiterated herein. In some embodiments, the base 11 can also be a flexible layer, and a material of the flexible layer can be polyimide, polyethylene terephthalate, polycarbonate, polyethylene naphthalate, polyethylene ether sulfone, polyarylate, etc., and are not specifically limited herein.

The conductive layer 12 is disposed on a surface of the base 11. A material of the conductive layer 12 can include one or more of metals, alloys, and metal oxides. Metals can include one or more of copper, silver, molybdenum, and aluminum, alloys can be an alloy composed of any two or more of afore-mentioned metals, such as silver-aluminum alloy, molybdenum-aluminum alloy, etc., and metal oxide can include titanium oxide, indium tin oxide, etc.

After forming the conductive layer 12, the method further includes a step of: forming a blocking portion 14 that is patterned on the conductive layer 12, and the blocking portion 14 defines a plurality of openings 141 on the conductive layer 12 corresponding to a plurality of light-emitting units (not shown in the figures) in a one-to-one correspondence, and the plurality of light-emitting unit can be organic light-emitting diodes, mini-light-emitting diodes, or micro-light-emitting diodes.

Step S102: providing a quantum dot mixture, wherein the quantum dot mixture includes a plurality of quantum dots 131 and a plurality of first nanoparticles 132, and a particle size of the plurality of first nanoparticles 132 ranges from 2 nm to 50 nm.

Within a range of the particle size mentioned above, since the Brownian motion of the plurality of first nanoparticles 132 is relatively strong, the plurality of first nanoparticles 132 can be efficiently dispersed in a solution of the quantum dot 131. In some embodiments, the particle size of the plurality of first nanoparticles 132 is 2 nm, 5 nm, 10 nm, 15 nm, 20 nm, 25 nm, 30 nm, 35 nm, 40 nm, 45 nm, or 50 nm.

Step S102 specifically includes the following steps:

Step S1021: providing the plurality of first nanoparticles 132, a surface modifiers, and an additive.

The plurality of first nanoparticles 132 can include one or more of silicon dioxide, titanium oxide, zirconium oxide, tungsten oxide, zinc oxide, and barium titanate. In this embodiment, surfaces of the plurality of first nanoparticles 132 have hydroxyl groups, e.g., the plurality of first nanoparticles 132 can be silicon dioxide.

Furthermore, the particle size of the plurality of first nanoparticles 132 ranges from 10 nm to 20 nm. Within a range of the particle size mentioned above, the Brownian motion of the plurality of first nanoparticles 132 can be intensified. In some embodiments, the particle size of the plurality of first nanoparticles 132 is 10 nm, 11 nm, 12 nm, 13 nm, 14 nm, 15 nm, 16 nm, 17 nm, 18 nm, 19 nm, or 20 nm.

It should be noted that, the plurality of first nanoparticles 132 can be prepared by a sol-gel method, and a specific method for preparing the plurality of first nanoparticles 132 by a sol-gel method can refer to the prior art, which is not reiterated herein.

The surface modifier is utilized to perform surface modification on the plurality of first nanoparticles 132 before surface modification, so as to enhance a dispersity of the plurality of first nanoparticles 132 among the plurality of quantum dots 131. The surface modifier can include carboxyl-containing or amino-containing polyethylene glycol, polyethylene adipate, or silane coupling agents.

Step S1022: dispersing the plurality of first nanoparticles 132 in the surface modifier to obtain a plurality of surface-modified first nanoparticles 132.

Specifically, when the plurality of first nanoparticles 132 are dispersed in the surface modifier, the surfaces of the plurality of first nanoparticles 132 is modified by the surface modifier to form surface modification ligands on the surfaces of the plurality of first nanoparticles 132, thereby forming the plurality of surface-modified first nanoparticles 132.

In this embodiment, after the surface modification of the plurality of first nanoparticles 132 is performed: firstly, steric hindrance of the plurality of first nanoparticles 132 is increased, thereby reducing an aggregation probability among the plurality of first nanoparticles 132, so as to increase the dispersity of the plurality of first nanoparticles 132; secondly, a zeta potential of the plurality of first nanoparticles 132 is increased, which can enhance a stability of the plurality of first nanoparticles 132; and thirdly, after the surface modification, due to an introduction of polar groups on the surfaces of the plurality of first nanoparticles 132, the polar groups can ionize more charges, so that the surfaces of the plurality of first nanoparticles 132 do not easily aggregate due to repulsive forces generated among the charges, which further facilitates the plurality of first nanoparticles 132 to disperse.

In this embodiment, a mass of the surface modifier is 20% to 60% of a mass of the plurality of first nanoparticles 132.

In some embodiments, the mass of the surface modifier can be 20%, 25%, 30%, 35%, 40%, 45%, 50%, 55%, or 60% of the mass of the plurality of first nanoparticles 132.

It should be noted that, in this embodiment, after forming the plurality of surface-modified first nanoparticles 132, a solution system in which the plurality of surface-modified first nanoparticles 132 are located is dried to form first nanoparticle powder.

Step S1023: dispersing the plurality of surface-modified first nanoparticles 132 in the additive to form a first nanoparticle dispersion.

The additive includes solvents and dispersants. After forming the first nanoparticle powder, the first nanoparticle powder is dispersed in a solvent and a dispersant.

Specifically, the solvent is utilized to dissolve the first nanoparticle powder. The solvent can include one or more of water, alcohol compounds, ether compounds, ester compounds, and alkane compounds. In some specific embodiments, the solvent can be ethanol, diethyl ether, ethyl acetate, n-octane, water, propylene glycol methyl ether acetate, etc., types of the solvent is not specifically limited in this application. The dispersant is utilized to increase a dispersity of the first nanoparticle powder in the solvent, and the dispersant can include one or more of stearic acid, polyethylene glycol fatty acid ester, and polyacrylamide.

In a preparation process of a first nanoparticle dispersion, the mass of the dispersant ranges from 0.3% to 10% of the mass of the plurality of first nanoparticles 132. Since the plurality of first nanoparticles 132 in this embodiment have undergone a surface modification treatment, an amount of the dispersant can be reduced during a preparation process of the first nanoparticle dispersion, i.e., within a range of the mass mentioned above, the first nanoparticle dispersion that is relatively stable and higher charged can be obtained, so as to prevent an increase in viscosity of a system when the amount of the dispersant is too large, which does not facilitate depositions of the plurality of first nanoparticles 132 and the plurality of quantum dots 131.

In some embodiments, the mass of the dispersant can be 0.3%, 0.5%, 1.0%, 2.0%, 2.5%, 3.0%, 3.5%, 4.0%, 4.5%, 5.0%, 5.5%, 6.0%, 6.5%, 7.0%, 7.5%, 8.0%, 8.5%, 9.0%, 9.5%, or 10.0% of the mass of the plurality of first nanoparticles 132.

In this embodiment, after a step of forming the first nanoparticle dispersion, the method further includes: forming a second nanoparticle dispersion.

The plurality of second nanoparticles 133 can include one or more of silicon dioxide, titanium oxide, zirconium oxide, tungsten oxide, zinc oxide, and barium titanate. In this embodiment, surfaces of the plurality of second nanoparticles 133 have hydroxyl groups, and in this case, the plurality of second nanoparticles 133 can be silicon dioxide.

Furthermore, the particle size of the plurality of second nanoparticles 133 ranges from 300 nm to 500 nm. Within a range of the particle size mentioned above, a Brownian motion of the plurality of second nanoparticles 133 can be intensified. In some specific embodiments, the particle size of the plurality of second nanoparticles 133 is 300 nm, 325 nm, 350 nm, 375 nm, 400 nm, 425 nm, 450 nm, 475 nm, or 500 nm.

It should be noted that, the plurality of second nanoparticles 133 can be prepared by a sol-gel method, and a specific method of preparing the plurality of second nanoparticles 133 by the sol-gel method can refer to the prior art, which will not be reiterated herein.

The surface modifier is utilized to perform surface modification on the plurality of second nanoparticles 133 before surface modification, so as to enhance a dispersity of the plurality of second nanoparticles 133 among the plurality of quantum dots 131. Specifically, when the plurality of second nanoparticles 133 are dispersed in the surface modifier, the surfaces of the plurality of second nanoparticles 133 is modified by the surface modifier to form surface modification ligands on the surfaces of the plurality of second nanoparticles 133, thereby forming a plurality of surface-modified second nanoparticles 133. The surface modifier can include carboxyl-containing or amino-containing polyethylene glycol, polyethylene adipate, or silane coupling agents.

In this embodiment, after the surface modification of the plurality of second nanoparticles 133 is performed: firstly, steric hindrance of the plurality of second nanoparticles 133 and the plurality of second nanoparticles 133 is increased, thereby reducing an aggregation probability among the plurality of second nanoparticles 133, so as to increase the dispersity of the plurality of second nanoparticles 133; secondly, a zeta potential of the plurality of second nanoparticles 133 is increased, which can enhance a stability of the plurality of second nanoparticles 133; and thirdly, after the surface modification, due to an introduction of polar groups on the surfaces of the plurality of second nanoparticles 133, the polar groups can ionize more charges, so that the surfaces of the plurality of second nanoparticles 133 do not easily aggregate due to repulsive forces generated among the charges, which further facilitates the plurality of second nanoparticles 133 to disperse.

In this embodiment, a mass of the surface modifier is 20% to 60% of a mass of the plurality of second nanoparticles 133. In some embodiments, the mass of the surface modifier can be 20%, 25%, 30%, 35%, 40%, 45%, 50%, 55%, or 60% of the mass of the plurality of second nanoparticles 133.

It should be noted that, in this embodiment, after forming the plurality of surface-modified second nanoparticles 133, a solution system in which the plurality of surface-modified second nanoparticles 133 are located is dried to form second nanoparticle powder.

The additive includes solvents and dispersants. After forming the second nanoparticle powder, the second nanoparticle powder is dispersed in a solvent and a dispersant. It should be noted that the solvent of the second nanoparticle powder is same as the solvent of the first nanoparticle powder, and the dispersant of the second nanoparticle powder is also same as the dispersant of the first nanoparticle powder, and will not be reiterated herein.

In a preparation process of a second nanoparticle dispersion, the mass of the dispersant ranges from 0.3% to 10% of the mass of the plurality of second nanoparticles 133. Since the plurality of second nanoparticles 133 in this embodiment have undergone a surface modification treatment, an amount of the dispersant can be reduced during a preparation process of the second nanoparticle dispersion, i.e., within a range of the mass mentioned above, the second nanoparticle dispersion that is relatively stable and higher charged can be obtained, so as to prevent an increase in viscosity of a system when the amount of the dispersant is too large, which does not facilitate depositions of the plurality of second nanoparticles 133 and the plurality of quantum dots 131.

In some embodiments, the mass of the dispersant can be 0.3%, 0.5%, 1.0%, 2.0%, 2.5%, 3.0%, 3.5%, 4.0%, 4.5%, 5.0%, 5.5%, 6.0%, 6.5%, 7.0%, 7.5%, 8.0%, 8.5%, 9.0%, 9.5%, or 10.0% of the mass of the plurality of second nanoparticles 133.

After the second nanoparticle dispersion is formed, the second nanoparticle dispersion and the first nanoparticle dispersion are mixed to obtain a first nanoparticle-second nanoparticle mixture.

It should be noted that, in this application, a preparation sequence of the first nanoparticle dispersion and the second nanoparticle dispersion is not specifically limited. In this embodiment, it is only taken as an example that the plurality of first nanoparticles 132 and the plurality of second nanoparticles 133 are respectively prepared into solutions and then forming the quantum dot mixture for illustration. In some embodiments, the plurality of first nanoparticles 132 and the plurality of second nanoparticles 133 can also be dissolved in a solvent and a dispersant to prepare a dispersion, so as to directly form the first nanoparticle-second nanoparticle mixture, and will not be repeated herein.

Step S1024: providing a quantum dot colloid solution and mixing the first nanoparticle dispersion with the quantum dot colloid solution to form a quantum dot mixture.

Specifically, a particle size of the plurality of quantum dots 131 ranges from 1 nm to 15 nm. The plurality of quantum dots 131 are composed of group IV, II-VI, IV-VI, or III-V elements, specifically, the plurality of quantum dots 131 are mainly composed of group IVA, IIB-VIA, IIIA-VA, or IVA-VIA elements. For example, when the plurality of quantum dots 131 are composed of group IVA elements, the plurality of quantum dots 131 can include carbon quantum dots, silicon quantum dots, or germanium quantum dots. When the plurality of quantum dots 131 are composed of group IIB-VIA elements, the plurality of quantum dots 131 can specifically include cadmium selenide quantum dots, zinc sulfide quantum dots, or cadmium sulfide quantum dots. When the plurality of quantum dots 131 are composed of group IIIA-VA elements, the plurality of quantum dots 131 can specifically include indium phosphide quantum dots, gallium arsenide quantum dots, or indium arsenide quantum dots. When the plurality of quantum dots 131 are composed of group IVA-VIA elements, the plurality of quantum dots 131 can specifically include lead sulfide quantum dots, lead selenide quantum dots, or lead telluride quantum dots. A specific material of the plurality of quantum dots 131 can be selected according to actual applications, which is not limited in the present application.

It should be noted that the quantum dot colloid solution is prepared by dispersing the plurality of quantum dots 131 in a solvent and a dispersant. For a preparation method of the quantum dot colloid solution, reference can be made to the prior art, which will not be repeated herein.

The solvent utilized in a preparation process of the quantum dot colloid solution can include one or more of water, alcohol compounds, ether compounds, ester compounds, and alkane compounds. In some specific embodiments, the solvent can be ethanol, diethyl ether, ethyl acetate, n-octane, water, propylene glycol methyl ether acetate, etc., and the present application is not limited to specific types of solvents mentioned above. The dispersant in the quantum dot colloid solution is used to enhance a dispersity of the plurality of quantum dots 131 in the solvent. Specifically, the dispersant can include one or more stearic acid, polyethylene glycol fatty acid ester, and polyacrylamide.

Specifically, in this embodiment, the first nanoparticle-second nanoparticle mixture is mixed with the quantum dot colloid solution to form the quantum dot mixture.

It should be noted that, in this embodiment, the plurality of first nanoparticles 132, the plurality of second nanoparticles 13, and the plurality of quantum dots 131 being respectively prepared into solutions and then forming the quantum dot mixture is only taken as an example. In some embodiments, the plurality of first nanoparticles 132, the plurality of second nanoparticles 133, and the plurality of quantum dots 131 are simultaneously dissolved in a solvent and a dispersant to prepare a solution, so as to directly form the quantum dot mixture, and will not be repeated herein.

Step S103: depositing the quantum dot mixture on the conductive layer 12.

In this embodiment, the quantum dot mixture is deposited through an electrophoretic deposition method. For a process of preparing the quantum dot film 13 through the electrophoretic deposition method, this embodiment provides two implementations in the following.

Referring to FIG. 11, taking the preparation method of the quantum dot substrate described in the first embodiment mentioned above as an example, in one of the implementations, a quantum dot mixture is deposited under a vertical electric field to form the quantum dot film 13.

Specifically, before the quantum dot substrate is formed, a top substrate 21 and a top electrode 22 are disposed above the quantum dot substrate 10 to be formed, and the top electrode 22 is located on a side of the top substrate 21 adjacent to the quantum dot substrate 10. Under an applied voltage V, a vertical electric field is formed between the top electrode 22 and the conductive layer 12. In the quantum dot mixture before the quantum dot film 13 is formed, the surfaces of the plurality of quantum dots 131, the surfaces of the plurality of first nanoparticles 132, and the surfaces of the plurality of second nanoparticles 133 are all charged. Therefore, under an action of the vertical electric field, both the plurality of first nanoparticles 132 and the plurality of second nanoparticles 133 can be deposited on the conductive layer 12 together with the plurality of quantum dots 131.

Referring to FIG. 12, taking the preparation method of the quantum dot substrate described in the second embodiment as an example, in another one of the implementations, the quantum dot mixture is deposited under a horizontal electric field to form the quantum dot film 13.

Specifically, under the applied voltage V, a horizontal electric field is formed between the first conductive electrode 121 and the second conductive electrode 122. In the quantum dot mixture before the quantum dot film 13 is formed, the surfaces of the plurality of quantum dots 131, the surfaces of the plurality of first nanoparticles 132, and the surfaces of the plurality of second nanoparticles 133 are all charged. Therefore, under an action of the horizontal electric field, both the plurality of first nanoparticles 132 and the plurality of second nanoparticles 133 can be deposited on the conductive layer 12 together with the plurality of quantum dots 131.

Step S104: curing the quantum dot mixture to form a quantum dot film 13 and dispensing the plurality of first nanoparticles 132 among the plurality of quantum dots 131.

Since the plurality of first nanoparticles 132 with a particle size ranging from 2 nm to 50 nm have a strong Brownian motion in the quantum dot film 13, the distances among the plurality of quantum dots 131 in the quantum dot film 13 can be increased, and the self-absorption phenomenon of the plurality of quantum dots 131 can be weakened, thereby greatly enhancing the luminous efficiency of the quantum dot film 13. In addition, since the plurality of first nanoparticles 132 have undergone the surface modification treatment before film formation, the surface modification treatment can increase the dispersity of the plurality of first nanoparticles 132 among the plurality of quantum dots 131, thereby making the distances among the plurality of quantum dots 131 uniform, which facilitates enhancing the luminous efficiency of the quantum dot film 13.

Furthermore, in this embodiment, compared with the plurality of first nanoparticles 132, an addition of the plurality of second nanoparticles 133 with larger particle sizes can increase scattering of light, and increase an optical path of the light in the quantum dot film 13, so that the light extraction rate of the quantum dot film 13 can be further increased, the blue light transmittance of the quantum dot film 13 can be reduced, the blue light transmittance of the quantum dot substrate 10 can be reduced, and the luminous efficiency of a quantum dot color film product can be enhanced.

It can be understood that, after step S104, in the embodiment shown in FIG. 11, the top substrate 21 and the top electrode 22 above the quantum dot substrate are required to be removed.

The quantum dot substrate, the method for preparing the same, and the display device thereof provided by embodiments of the present application are described in detail above, and the description of embodiments above is only for helping to understand technical solutions of the present application and its core idea. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A quantum dot substrate comprising a quantum dot film, wherein the quantum dot film comprises a plurality of quantum dots, a plurality of first nanoparticles and a plurality of second nanoparticles dispersed among the plurality of quantum dots, and a particle size of the plurality of first nanoparticles ranges from 2 nanometers (nm) to 50 nm, and
wherein a ratio of a mass percentage of the plurality of first nanoparticles and the plurality of second nanoparticles in the quantum dot film to a mass percentage of the plurality of quantum dots in the quantum dot film ranges from 1:50 to 1:10.

2. The quantum dot substrate according to claim 1, wherein the particle size of the plurality of first nanoparticles ranges from 10 nm to 20 nm.

3. The quantum dot substrate according to claim 1, wherein a particle size of the plurality of second nanoparticles is greater than the particle size of the plurality of first nanoparticles.

4. The quantum dot substrate according to claim 3, wherein the particle size of the plurality of second nanoparticles ranges from 300 nm to 500 nm.

5. The quantum dot substrate according to claim 3, wherein the plurality of first nanoparticles and the plurality of second nanoparticles comprise same surface modification ligands.

6. The quantum dot substrate according to claim 1, wherein a mass percentage of the plurality of first nanoparticles in the quantum dot film is greater than a mass percentage of the plurality of second nanoparticles in the quantum dot film.

7. The quantum dot substrate according to claim 6, wherein a ratio of the mass percentage of the plurality of first nanoparticles in the quantum dot film to the mass percentage of the plurality of second nanoparticles in the quantum dot film ranges from 5:1 to 20:1.

8. The quantum dot substrate according to claim 1, wherein the plurality of first nanoparticles comprise one or more of silicon dioxide, titanium oxide, zirconium oxide, tungsten oxide, zinc oxide, or barium titanate.

9. The quantum dot substrate according to claim 1, wherein the quantum dot substrate further comprises a base and a conductive layer disposed on the base, and the quantum dot film is disposed on a side of the conductive layer away from the base.

10. The quantum dot substrate according to claim 9, wherein the conductive layer comprises a first conductive electrode and a second conductive electrode, a pattern of the first conductive electrode and a pattern of the second conductive electrode are matched to each other, the quantum dot film covers one of the first conductive electrode and the second conductive electrode, and a pattern of the quantum dot film is same as one of the pattern of the first conductive electrode and the pattern of the second conductive electrode.

11. A display device comprising the quantum dot substrate as claimed in claim 1.

12. The display device according to claim 11, wherein the particle size of the plurality of first nanoparticles ranges from 10 nm to 20 nm.

13. The display device according to claim 11, wherein the particle size of the plurality of second nanoparticles ranges from 300 nm to 500 nm.

14. The display device according to claim 13, wherein the plurality of first nanoparticles and the plurality of second nanoparticles comprise same surface modification ligands.

15. The quantum dot substrate according to claim 5, wherein the surface modification ligands are derived from a surface modifier, and a mass of the surface modifier is 20% to 60% of a mass of the plurality of first nanoparticles.

16. The quantum dot substrate according to claim 15, wherein surfaces of the plurality of first nanoparticles and/or the plurality of second nanoparticles have hydroxyl groups, and the surface modifier comprises carboxyl-containing or amino-containing polyethylene glycol, polyethylene adipate, or silane coupling agents.

* * * * *